(12) United States Patent
Uto

(10) Patent No.: US 6,573,798 B2
(45) Date of Patent: Jun. 3, 2003

(54) PLL SYSTEM FOR CRT MONITOR

(75) Inventor: Yoshiyuki Uto, Kanagawa (JP)

(73) Assignee: NEC Electronics Corporation, Kawasaki (JP)

( * ) Notice: Subject to any disclaimer, the term of this patent is extended or adjusted under 35 U.S.C. 154(b) by 0 days.

(21) Appl. No.: 09/901,726

(22) Filed: Jul. 11, 2001

(65) Prior Publication Data

US 2002/0021177 A1 Feb. 21, 2002

(30) Foreign Application Priority Data

Jul. 13, 2000 (JP) ........................ 2000-213316

(51) Int. Cl.[7] .................................. H03L 7/00
(52) U.S. Cl. .......................... 331/16; 327/158
(58) Field of Search ...................... 331/16, 17, 25; 348/540, 536; 327/148, 158

(56) References Cited

U.S. PATENT DOCUMENTS 4,885,554 A * 12/1989 Wimmer ...................... 327/157
5,614,870 A * 3/1997 Sauer et al. ................... 331/14
6,140,881 A * 10/2000 Kim ............................. 331/25

FOREIGN PATENT DOCUMENTS

| JP | 5-175834 | 7/1993 |
| JP | 06-232741 | 8/1994 |
| JP | 08-056368 | 2/1996 |
| JP | 09-093125 | 4/1997 |
| JP | 2001-160752 | 6/2001 |

* cited by examiner

Primary Examiner—Tuan T. Lam
(74) Attorney, Agent, or Firm—McGinn & Gibb, PLLC

(57) ABSTRACT

A PLL system includes a phase comparator, charge pump, LPF, VCO, 1/N frequency divider, CRT drive circuit, and arithmetic unit. The charge pump outputs a charge pump signal in accordance with the phase error signal output from the phase comparator. The current capacity of the charge pump is controlled to keep a PLL loop gain constant by compensation for a variation in PLL loop gain due to a change in a frequency division ratio 1/N in the frequency divider.

22 Claims, 7 Drawing Sheets

PLL SYSTEM FOR CRT MONITOR

BACKGROUND OF THE INVENTION

The present invention relates to a PLL (Phase Locked Loop) system for a CRT (Cathode Ray Tube) monitor, which can cope with a deterioration in characteristic due to variations in the loop gain of a PLL.

In general, a PLL system for a CRT monitor uses a PLL loop block designed to frequency-divide an output from a voltage-controlled oscillator (VCO) by using a programmable frequency divider. In the conventional system, since the frequency range of horizontal sync signals input to the PLL loop block is as narrow as about 15 kHz to 80 kHz, no measure has been taken against variations in loop gain due to the programmable 1/N frequency divider.

In recent CRT monitors, however, with an increase in resolution, the frequency range of horizontal sync signals input has extended from about 15 kHz to 150 kHz. For this reason, the loop gain of the PLL loop greatly varies. This worsens unlocked states and jitter in the PLL loop. In practice, to solve this problem, a loop gain is set for the PLL loop so as to prevent the occurrence of an unlocked state in the PLL loop at the expense of jitter characteristics.

FIG. 6 shows a conventional PLL system for a CRT monitor. The conventional PLL system includes a PLL loop block 11 for phase-locking a horizontal sync (H sync) signal 1 which is an input signal, an arithmetic unit 12 for measuring the frequency of the horizontal sync signal 1, and an arithmetic device 13 which operates with a system clock 7 having a predetermined frequency from the PLL loop block 11.

The PLL loop block 11 includes a phase comparator 14 of the edge comparison type, which compares the horizontal sync signal 1 as a reference signal with an FBP signal 4 as a comparison signal and outputs an error signal 2 representing the phase difference, a charge pump 15 for generating a DC voltage in accordance with the error signal 2 from the phase comparator 14, an LPF 16 for converting the DC voltage output from the charge pump 15 into a control voltage, a VCO 17 for changing the oscillation frequency in accordance with the control voltage output from the LPF 16, a programmable 1/N frequency divider 18 in which a frequency division ratio N (N is a positive integer) is variably set in accordance with the frequency of the horizontal sync signal 1, and a CRT drive circuit 19 for performing deflection processing in the CRT on the basis of a horizontal drive (HOUT) signal 3 obtained by frequency-dividing an output from the VCO 17 by using the 1/N frequency divider 18. The CRT drive circuit 19 controls the phase comparator 14 in accordance with the flyback pulse (FBP) signal 4 received through a high-voltage transformer circuit or the like as well as performing deflection processing.

The operation of the conventional PLL system shown in FIG. 6 will be described next with reference to the flow chart of FIG. 7. When the power supply is turned on (step S1), the frequency of the horizontal sync signal 1 is observed (step S2) to check whether the frequency has changed (step S3). If the frequency of the horizontal sync signal 1 has changed, the arithmetic unit 12 calculates a frequency division ratio (step S4) and sets the calculated frequency division ratio in the programmable 1/N frequency divider 18 (step S5). After the frequency division ratio is set, the flow returns to step S2. If it is determined in step S3 that the frequency of the horizontal sync signal 1 has not changed, the flow immediately returns to step S2 to observe the frequency of the horizontal sync signal 1. If the operation of the PLL loop becomes unnecessary, the power supply is turned off to terminate the above operation.

According to the prior art described above, as the frequency range of input horizontal sync signals 1 extends from about 15 kHz to 150 kHz with an increase in resolution, as in recent CRT monitors, variations in loop gain increase, worsening unlocked states and jitter. In practice, a loop gain is so set as to prevent the occurrence of an unlocked state at the expense of jitter characteristics. In addition, as is obvious from equation (2) (to be described later), the loop gain changes with a change in the frequency of the horizontal sync signal 1.

Japanese Patent Laid-Open No. 5-175834 (reference 1) discloses a PLL loop which is made to have an optimal response characteristic in accordance with variations in frequency division ratio and loop gain. In the PLL loop disclosed in this reference 1, since a predetermined switch (selection circuit) is switched in advance, a complicated arrangement is required.

SUMMARY OF THE INVENTION

It is an object of the present invention to provide a PLL system for a CRT monitor, which maintains a PLL loop gain constant and prevents the occurrence of an unlocked state and worsening of jitter due to variations in PLL loop gain.

In order to achieve the above object, according to the present invention, there is provided a PLL system comprising phase comparison means for comparing a phase of an input horizontal sync signal with a phase of a comparison signal, variable-capacity charge pump means for outputting a charge pump signal in accordance with a phase error signal output from the phase comparison means, filter means for converting the charge pump signal from the charge pump means into a voltage control signal, a voltage-controlled oscillator for changing an oscillation frequency in accordance with the voltage control signal output from the filter means, frequency division means for performing 1/N frequency division of a frequency signal output from the voltage-controlled oscillator in accordance with a control signal, CRT drive means for performing deflection processing in a CRT on the basis of an output from the frequency division means and outputting, to the phase comparison means, a comparison signal based on a reference signal for a display system which is generated by CRT deflection processing, and arithmetic means for calculating a control signal to be output to the frequency division means from the horizontal sync signal, wherein a charge pump gain of the charge pump means is so controlled as to keep a PLL loop gain constant by compensating for a variation in PLL loop gain due to a change in a frequency division ratio 1/N in the frequency division means.

DESCRIPTION OF THE PREFERRED EMBODIMENTS

The present invention will be described in detail below with reference to the accompanying drawings.

Figure 1:
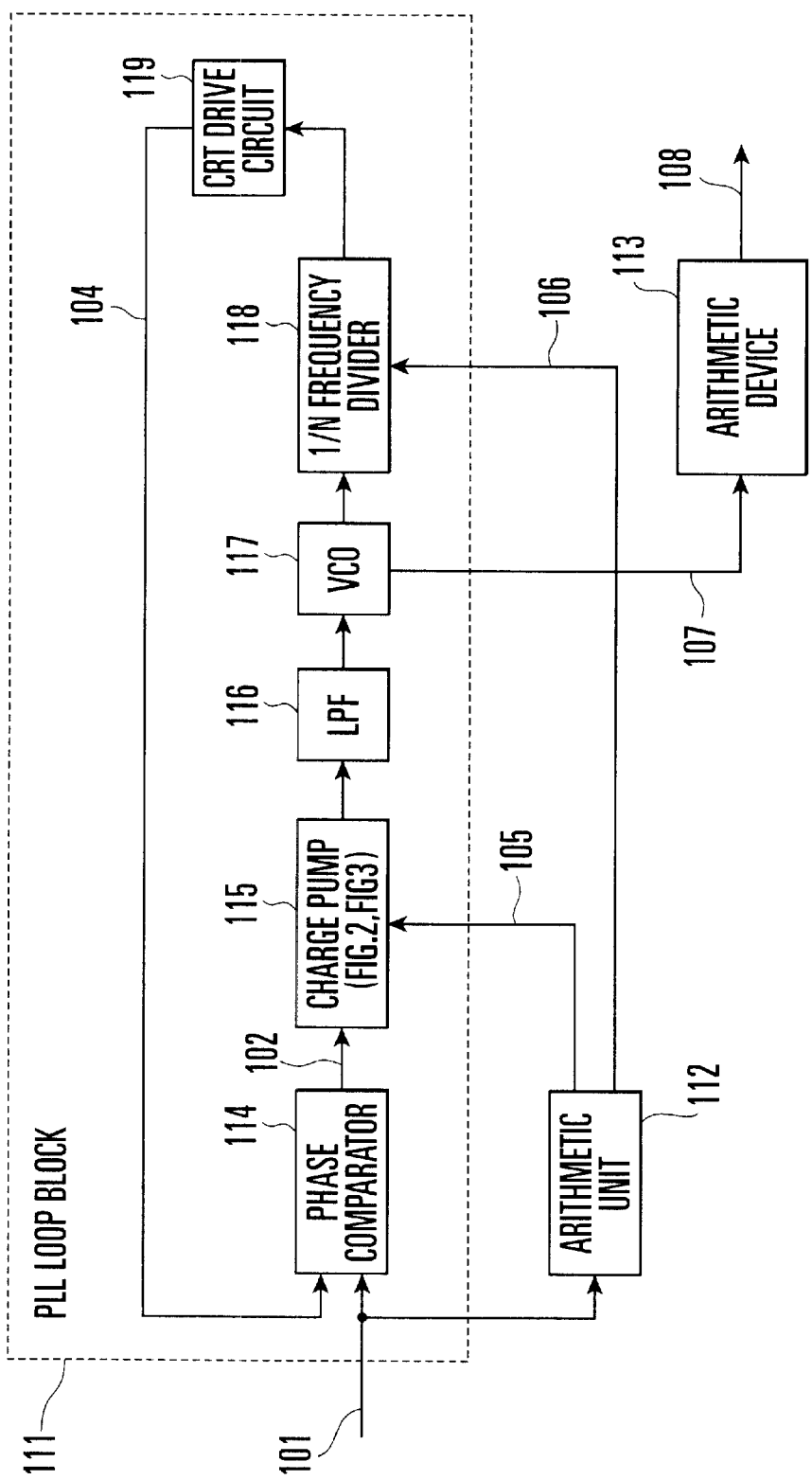
FIG. 1 is a block diagram showing a PLL system according to an embodiment of the present invention.

FIG. 1 shows a PLL system according to the first embodiment of the present invention. The PLL system shown in FIG. 1 includes a PLL loop block 111 for phase-locking a horizontal sync (H sync) signal 101 which is an input signal, an arithmetic unit 112 for measuring the input frequency of the horizontal sync signal 101 and calculating a frequency division ratio for a 1/N frequency divider (to be described later) to keep the frequency of a system clock 107 constant, and an arithmetic device 113 that operates on the system clock 107 having a constant frequency which is output from the PLL loop block 111 and outputs various control data required for the CRT monitor.

The PLL loop block 111 is comprised of a phase comparator 114 of the edge comparison type which compares the frequency and phase of the horizontal sync signal 101 as a reference signal with those of an FBP signal 104 as a reference signal, a variable-capacity charge pump (to be referred to as a charge pump hereinafter) 115 for outputting a DC charge pump signal in accordance with an error signal (UP/DOWN signal) 102 which is output from the phase comparator 114 and represents a phase difference, an LPF 116 for converting the charge pump signal output from the charge pump 115 into a controlled voltage signal, a VCO 117 whose oscillation frequency changes in accordance with the control voltage signal output from the LPF 116, a programmable 1/N frequency divider (to be referred to as 1/N frequency divider hereinafter) 118 in which a frequency division ratio N is variably set in accordance with the input frequency of the horizontal sync signal 101 to always keep the frequency of the system clock 107 constant, and a CRT drive circuit 119 for performing deflection processing in the CRT on the basis of a horizontal drive (HOUT) signal 103 obtained by frequency-dividing the output from the VCO 117 using the 1/N frequency divider 118.

The CRT drive circuit 119 raises an electron beam deflection voltage up to several kV on the basis of the HOUT signal 103 to perform deflection processing by using a horizontal retrace line. The flyback pulse (FBP) signal 104 is a display reference signal for the CRT monitor which has passed through a deflection coil for generating a deflection voltage and is used to phase-lock the input horizontal sync signal 101. In this phase locking operation, the phase comparator 114 is controlled by the FBP signal 104.

The arithmetic unit 112 uses a CPU (Central Processing Unit) or DSP (Digital Signal Processor) to measure the frequency of the input horizontal sync signal 101 and calculate the necessary frequency division ratio N of the 1/N frequency divider 118 and the capacity of the charge pump 115 based on the frequency division ratio N. A frequency division ratio signal 106 and charge pump (capacity) setting signal 105 are output to the 1/N frequency divider 118 and charge pump 115, respectively.

The arithmetic device 113 generates various control data 108 used for digital signal processing required for the CRT monitor on the basis of the system clock 107 synchronized with the horizontal sync signal 101 from the PLL loop block 111. The various control data 108 include, for example, a PIN correction output, KEY correction output, dynamic convergence correction output, and static convergence correction output.

Figure 2:
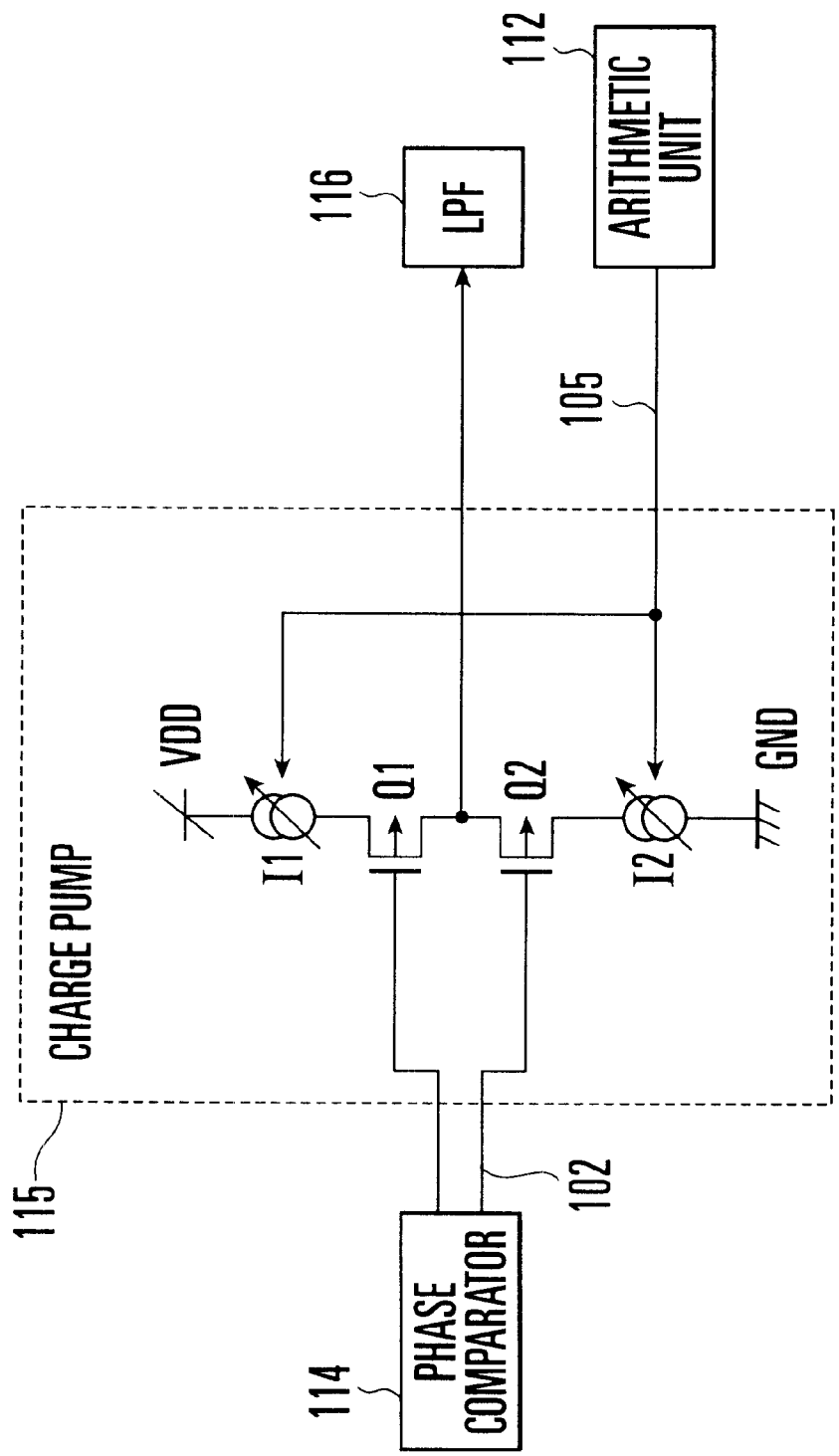
FIG. 2 is a schematic block diagram showing a variable-capacity charge pump in FIG. 1.

FIG. 2 shows the charge pump 115. The charge pump 115 is comprised of a P-channel MOS (Metal Oxide Semiconductor) transistor Q1 having a gate to which a positive-phase output (UP signal) from the phase comparator 114 is input, a variable current source I1 connected between the source of the MOS transistor Q1 and a power supply VDD, an N-channel MOS transistor Q2 having a gate to which a negative-phase output (down signal) from the phase comparator 114 is input and a commonly connected drain connected to the drain of the MOS transistor Q1, and a variable current source I2 connected between the source of the MOS transistor Q2 and ground GND. The node of the MOS transistors Q1 and Q2 is connected to the LPF 116. The arithmetic unit 112 controls the variable current sources I1 and I2 to compensate for variations in PLL loop gain.

Figure 3:
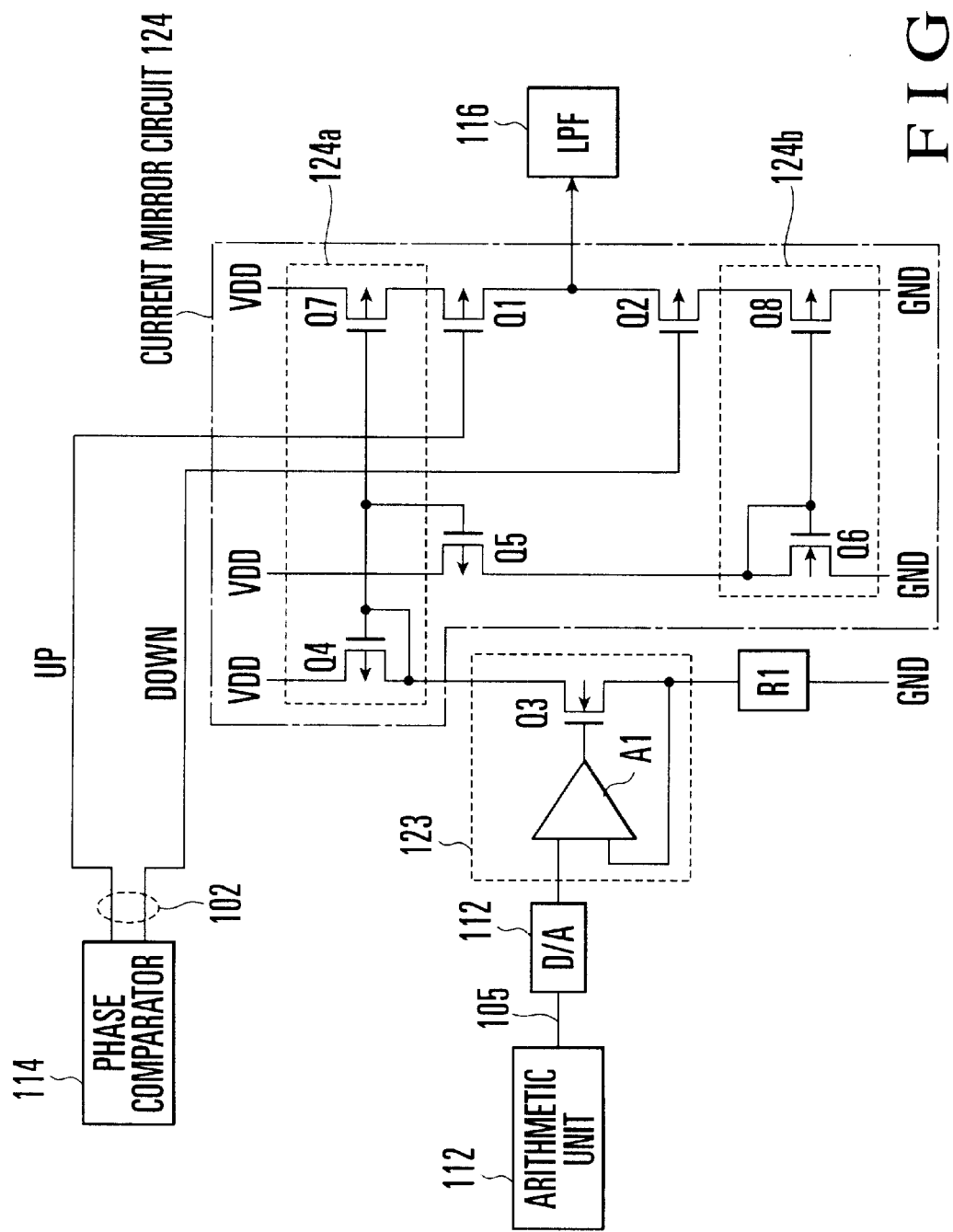
FIG. 3 is a block diagram showing the variable-capacity charge pump in FIG. 1 in detail.

FIG. 3 shows the charge pump 115 in detail. The variable current sources I1 and I2 of the charge pump 115 are comprised of a D/A converter (D/A) 122 for converting an output from the arithmetic unit 112 into an analog signal (DC voltage), a voltage follower 123 for level-converting an output voltage from the D/A 122, and a current mirror circuit 124 for controlling currents flowing through the MOS transistors Q1 and Q2 in accordance with an output voltage from the voltage follower 123.

The voltage follower 123 is constituted by an operational amplifier A1 for amplifying an output voltage from the D/A 122, and an N-channel MOS transistor Q3 that is gate-controlled by an output from the operational amplifier A1. The first input terminal of the operational amplifier A1 is connected to the output terminal of the D/A 122, and the second input terminal is connected to the source of the MOS transistor Q3. The source of the MOS transistor Q3 is connected to the ground GND through a resistor R1. An output voltage from the D/A 122 is converted into a current by the voltage follower 123 and resistor R1. This current is then output to the LPF 116 through the current mirror circuit 124.

The current mirror circuit 124 includes a first current mirror section 124a constituted by a pair of P-channel MOS transistors Q4 and Q7 which receive an output from the MOS transistor Q3, a P-channel MOS transistor Q5 which receives an output from the MOS transistor Q3, and a second current mirror section 124b constituted by a pair of N-channel MOS transistors Q6 and Q8 which receive an output from the MOS transistor Q5.

In the first current mirror section 124a, the drain and gate of the MOS transistor Q4 are connected to the drain of the MOS transistor Q3, and the source of the MOS transistor Q4 is connected to the power supply VDD. The drain of the MOS transistor Q7 is connected to the source of the MOS transistor Q1, and the source of the MOS transistor Q7 is connected to the power supply VDD. The gate of the MOS transistor Q7 is connected to the gate of the MOS transistor Q4.

In the second current mirror section 124b, the drain and gate of the MOS transistor Q6 are connected to the drain of the MOS transistor Q5, and the source of the MOS transistor Q6 is connected to the ground GND. The drain of the MOS transistor Q8 is connected to the source of the MOS transistor Q2, and the source of the MOS transistor Q8 is connected to the ground GND. The gate of the MOS transistor Q8 is connected to the drain of the MOS transistor Q5.

With this arrangement, the capacity of the charge pump 115 can be controlled by the charge pump capacity setting signal 105 from the arithmetic unit 112. This makes it possible to control the gain of the charge pump 115 so as to compensate for variations in PLL loop gain.

The operation of the PLL system having the above arrangement will be described next. In the CRT monitor for performing digital signal processing, the various control data 108 used for digital signal processing required for monitor control are generated by using the arithmetic device 113 which operates with the system clock 107 having a constant frequency in synchronism with the input horizontal sync signal 101.

For this purpose, the PLL loop block 111 in FIG. 1 is used. In addition, since the CRT monitor must cope with a wide range of resolutions, signals in the wide frequency range from 15 kHz to 150 kHz have recently been used as the horizontal sync signals 101 serving as reference clocks for the PLL loop block 111. Since digital signal processing is generally implemented by a MOS IC (MOS Integrate Circuit), the VCO 117 is also implemented by a MOS IC.

In general, in the case of a MOS IC, since the oscillation frequency cannot be greatly changed, and a constant system clock is required, the frequency division ratios are switched in the 1/N frequency divider 118. In general, therefore, the input frequency of the horizontal sync signal 101 is measured and calculated by the arithmetic unit 112, and the system clock 107 having a constant period is generated by changing the value N of the programmable 1/N frequency divider 118.

The arithmetic unit 112 outputs the value N for the 1/N frequency divider 118 by performing arithmetic operation represented by equation (1):

$$\text{value N} = \text{frequency of system clock/frequency of horizontal sync signal} \quad (1)$$

Assume that the frequency of the necessary system clock 107 is 100 MHz, and the frequency of the horizontal sync signal 101 is either 100 kHz or 50 kHz. In this case, frequency division ratios Nn (100 kHz) and Na (50 kHz) are given by Nn (100 kHz)=100 MHz/100 kHz=1000

Na (50 kHz)=100 MHz/50 kHz=2000

Therefore, the frequency division N for 100 kHz is set to 1000, and the frequency division ratio N for 50 kHz is set to 2000. That is, since the system clock 107 having a constant frequency is required, the frequency division ratio N changes in accordance with the frequency of the horizontal sync signal 101.

As the value N of the 1/N frequency divider 118 changes, the loop gain of the PLL loop block 111 varies, as indicated by equation (2). If Kp=phase comparator+charge pump gain, and Kv=VCO controls sensitivity, a loop gain K is given by $$K = Kp \cdot Kv \cdot 1/N \quad (b\ 2)$$

For example, letting Kn (100 kHz) and Ka (50 kHz) be loop gains for a horizontal sync signal having a frequency of 100 kHz and a horizontal sync signal having a frequency of 50 kHz, Kn (100 kHz)=Kp·Kv·1/1000

Ka (50 kHz)=Kp·Kv·1/2000

Obviously, a loop gain K2 for a frequency of 50 kHz becomes twice as high as a loop gain K1 for a frequency of 100 kHz. Therefore, variations in loop gain are suppressed by controlling the capacity of the charge pump 115.

In the PLL loop block 111 to which the horizontal sync signal 101 having a given frequency is input, the optimal loop gain Kn is represented by $$Kn = Kpn \cdot Kv \cdot 1/Nn \quad (3)$$

where Kpn=phase comparator+charge pump, Kv=VCO control sensitivity, and Nn=N of 1/N frequency divider.

The loop gain Ka after the frequency of the horizontal sync signal 101 changes to another frequency is given by $$Ka = Kpa \cdot Kv \cdot 1/Na \quad (4)$$

where Kpa=phase comparator+charge pump gain, Kv=VCO sensitivity, and Na=N of 1/N frequency divider.

The arithmetic unit 112 performs control so that phase comparator+charge pump gain Kp after a change is given as follows according to equations (3) and (4):

$$Kpa = Kpn \cdot Na/Na \quad (5)$$

With this operation, $$\begin{aligned} Ka &= Kpa \cdot Kv \cdot 1/Na \\ &= (Kpn \cdot Na/Nn) \cdot Kv \cdot 1/Na \\ &= Kpn \cdot Kv \cdot 1/Na \\ &= Kn \end{aligned} \quad (6)$$

By controlling the phase comparator+charge pump gain, the loop gain of the PLL loop block 111 can always be kept constant even if the frequency of the horizontal sync signal 101 changes.

Assume that when the frequency of the horizontal sync signal 101 changes from 100 kHz to 50 kHz, the corresponding frequency division ratios are represented by Nn (100 kHz) and Na (50 kHz), the corresponding loop gains are represented by Kn (100 kHz) and Ka (50 kHz), and the corresponding phase comparator+charge pump gains are represented by Kpn (100 kHz) and Kpa (50 kHz). In this case, according to equation (5)

$$\begin{aligned} Kpa(50\ \text{kHz}) &= Kpn\,(100\ \text{kHz}) \cdot Na\,(50\ \text{kHz})/\,Nn\,(100\ \text{kHz}) \\ &= Kpn\,(100\ \text{kHz}) \cdot 2000/1000 \\ &= 2 \cdot Kpn\,(100\ \text{kHz}) \end{aligned}$$

When, therefore, the frequency of the horizontal sync signal 101 changes from 50 kHz to 100 kHz, the phase comparator+charge pump gain is doubled. In this case, according to equation (6), the loop gain is given by $$\begin{aligned} Ka\,(50\ \text{kHz}) &= Kpa\,(50\ \text{kHz}) \cdot Kv \cdot 1/Na\,(50\ \text{kHz}) \\ &= 2 \cdot Kpn\,(100\ \text{kHz}) \cdot Kv \cdot 1/2000 \\ &= Kpn\,(100\ \text{kHz}) \cdot Kv \cdot 1/1000 \\ &= Kpn\,(100\ \text{kHz}) \cdot Kv \cdot 1/Nn\,(100\ \text{kHz}) \\ &= Kn\,(100\ \text{kHz}) \end{aligned}$$

Obviously, there is no variation in loop gain.

That is, by compensating for variations in loop gain due to a change in the frequency division ratio of the 1/N frequency divider 118 with a change in the frequency of the horizontal sync signal 101 using the charge pump 115, the loop gain of the PLL loop block 111 can be kept constant.

Figure 4:
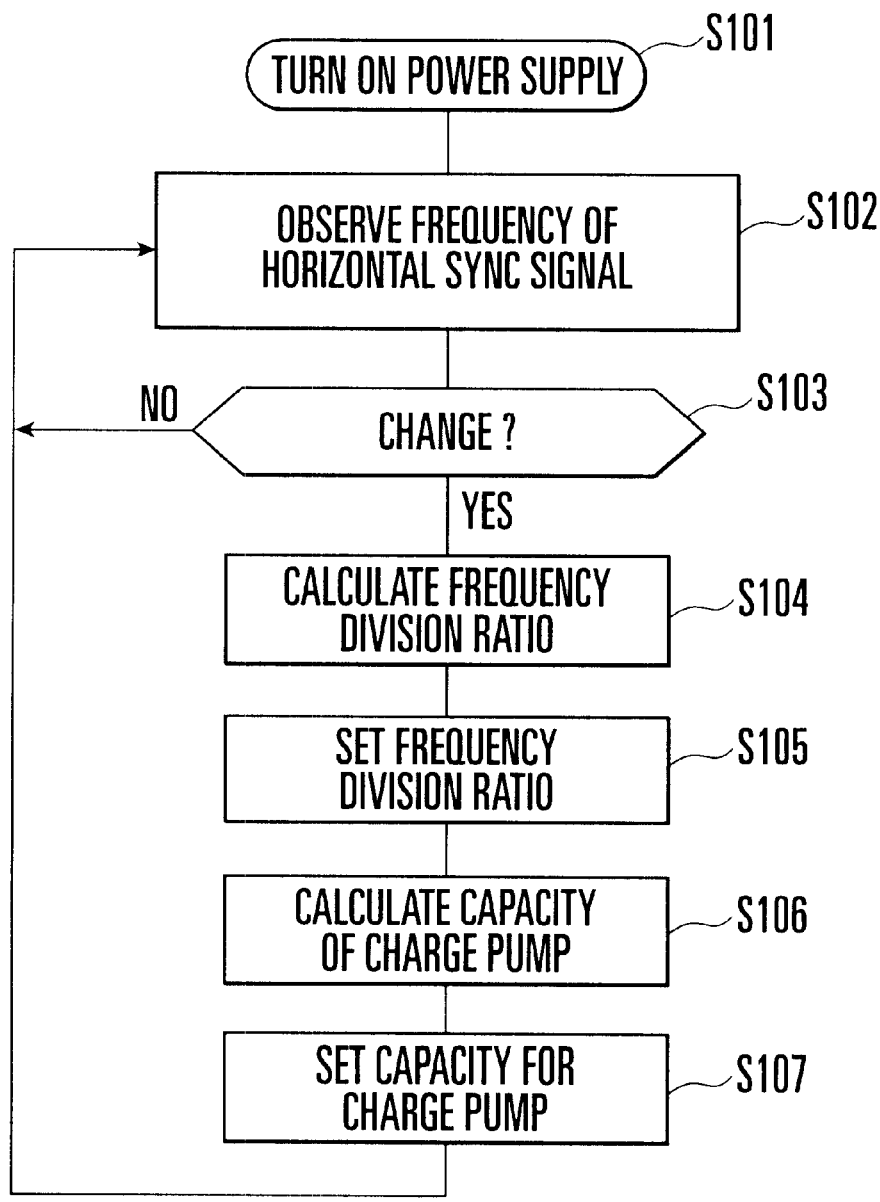
FIG. 4 is a flow chart for explaining the operation of the PLL system in FIG. 1.
Figure 7:
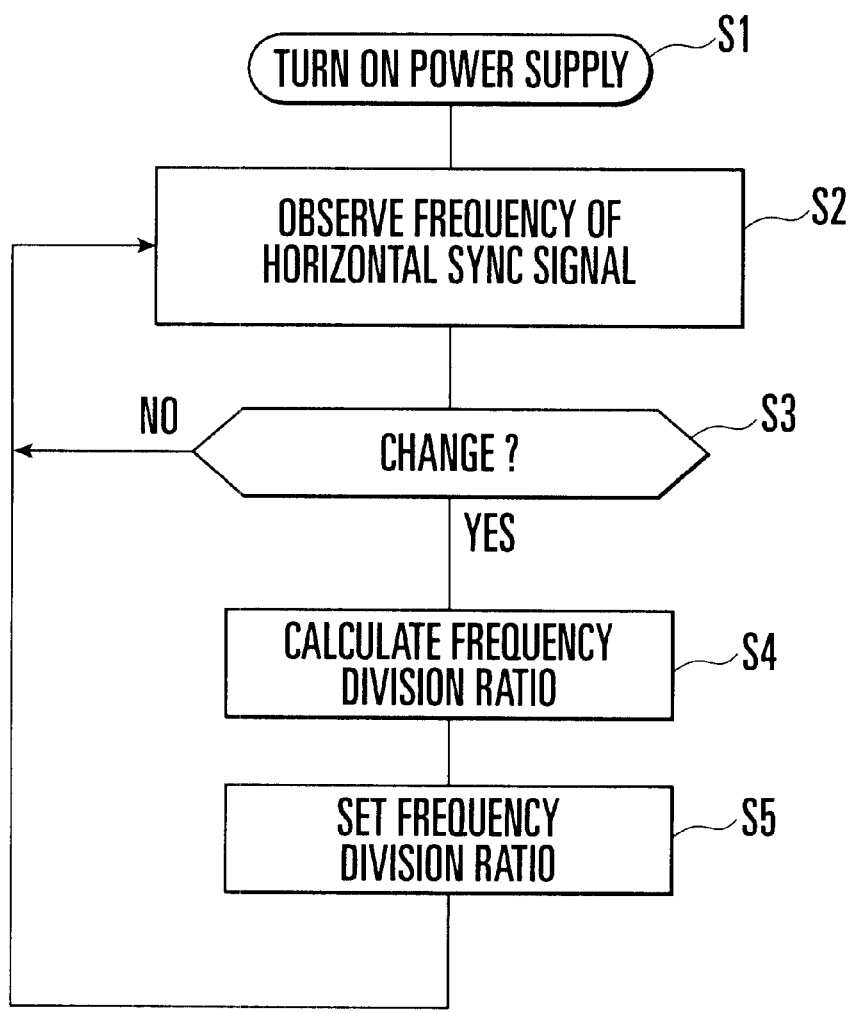
FIG. 7 is a flow chart for explaining the operation of the PLL system in FIG. 6.

The operation of the PLL system will be described next with reference to the flow chart of FIG. 4. Referring to FIG. 4, the processing in steps S101 to S105 is the same as that in steps S1 to S5 in FIG. 7, and steps S106 and S107 are added. When the power supply is turned on (step S101), the frequency of the horizontal sync signal 101 is observed (step S102) to check whether the frequency has changed (step S103). If the frequency of the horizontal sync signal 101 has changed, the arithmetic unit 112 calculates a frequency division ratio (step S104) and sets the calculated frequency division ratio in the 1/N frequency divider 118 (step S105).

The arithmetic unit 112 then calculates a charge pump gain (step S106), and sets the calculated charge pump gain in the charge pump 115 (step S107). After the gain is set, the flow returns to step S102. If it is determined in step S103 that the frequency of the horizontal sync signal 101 has not changed, the flow immediately returns to step S102 to observe the frequency of the horizontal sync signal 101. If the operation of the PLL loop becomes unnecessary, the power supply is turned off to terminate the above operation.

Figure 5:
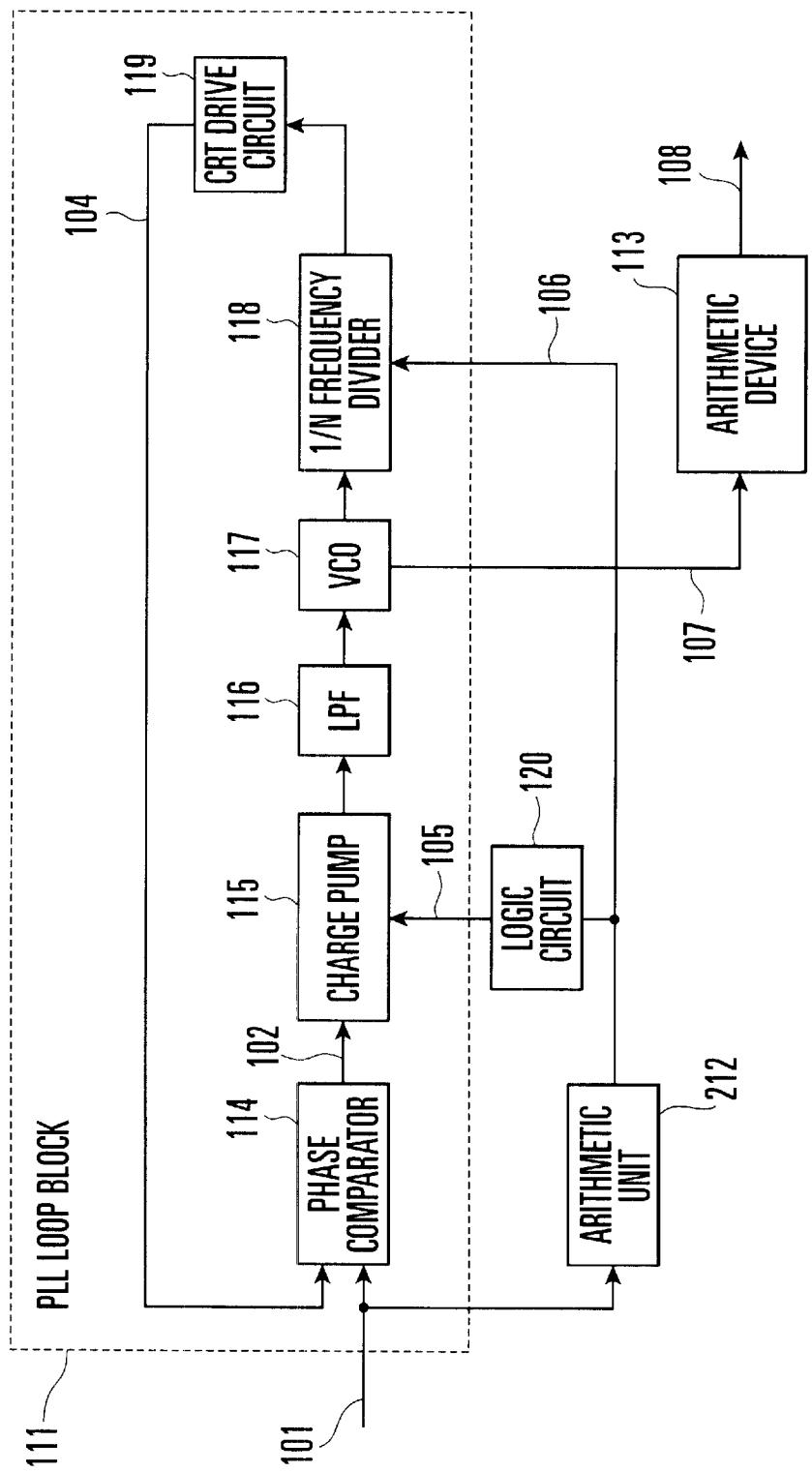
FIG. 5 is a block diagram showing a PLL system according to the second embodiment of the present invention.
Figure 6:
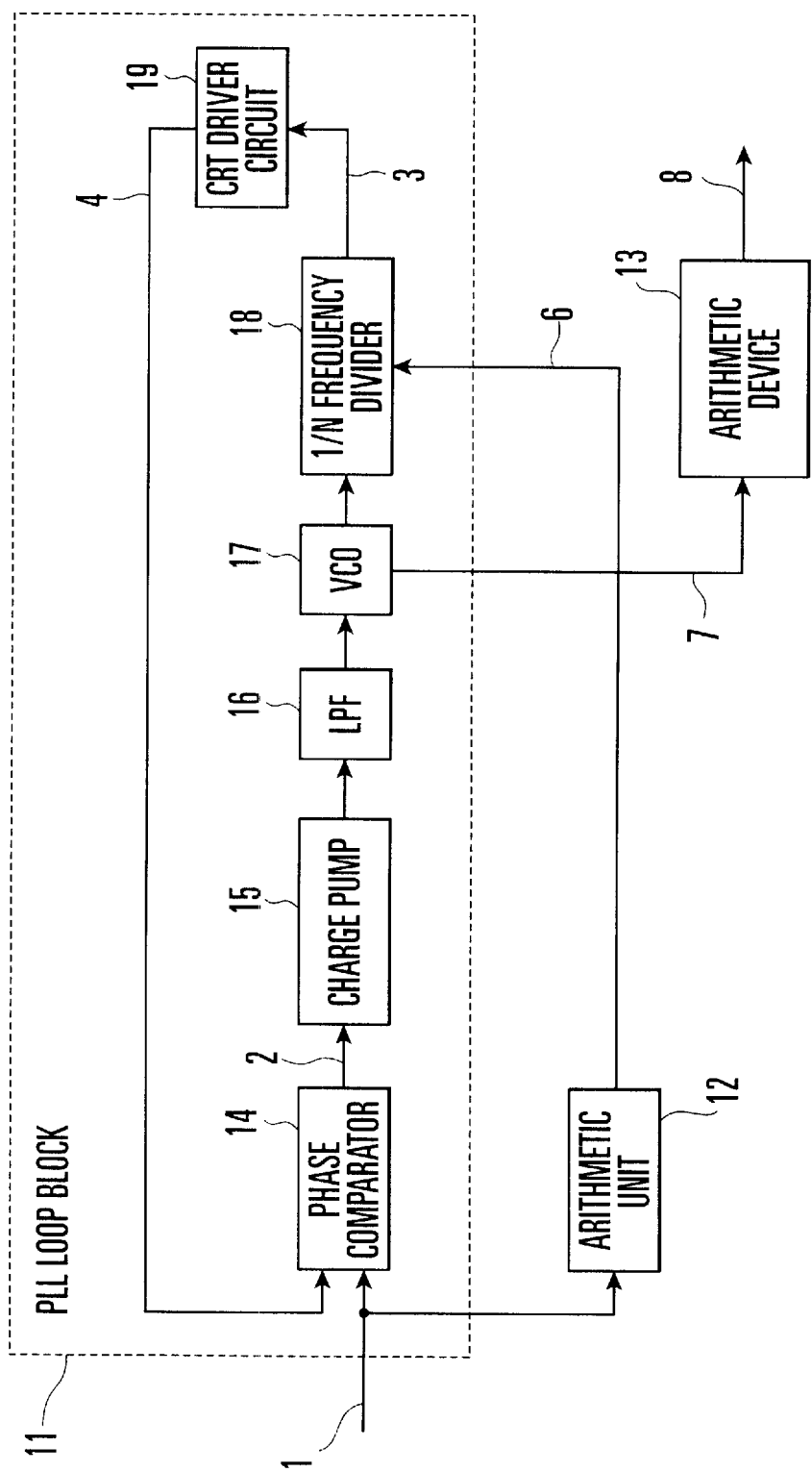
FIG. 6 is a block diagram showing a conventional PLL system for a CRT monitor.

FIG. 5 shows a PLL system according to the second embodiment of the present invention. This embodiment differs from the first embodiment in that a charge pump 115 is controlled by using a frequency division ratio signal 106 output from an arithmetic unit 212 and a logic circuit 120 instead of using the arithmetic unit 112. The logic circuit 120 forms a decoder on the basis of the value of the frequency division ratio signal 106, and controls the charge pump 115 by using the decoded value. The frequency division ratio signal 106 is formed on the basis of the frequency of a horizontal sync signal 101. To control the charge pump by using the frequency division ratio signal 106, therefore, it is only required to form a decoder. For this reason, the logic circuit 120 and a PLL system can be easily implemented.

As has been described above, according to the present invention, since the loop gain of the PLL loop is kept constant even if the frequency of a horizontal sync signal changes, the following effects are obtained. First, even if the frequency of a horizontal sync signal changes, the occurrence of a PLL unlocked state due to an insufficient or excessive loop gain can be prevented.

Second, in a PLL for a CRT monitor, since jitter components are directly viewed as jitter of images on the display screen, it is important to suppress the jitter. According to the present invention, even if the frequency of a horizontal sync signal changes, variations in damping factor (PLL loop stability) due to variations in loop gain are suppressed, thus preventing worsening of the jitter due the change in frequency.

What is claimed is:

1. A PLL system comprising:

phase comparison means for comparing a phase of an input horizontal sync signal with a phase of a comparison signal;

variable-capacity charge pump means for outputting a charge pump signal in accordance with a phase error signal output from said phase comparison means;

filter means for converting the charge pump signal from said charge pump means into a voltage control signal;

a voltage-controlled oscillator for changing an oscillation frequency in accordance with the voltage control signal output from said filter means;

frequency division means for performing 1/N frequency division of a frequency signal output from said voltage-controlled oscillator in accordance with a control signal;

CRT drive means for performing deflection processing in a CRT on the basis of an output from said frequency division means and outputting, to said phase comparison means, said comparison signal based on a reference signal for a display system which is generated by CRT deflection processing; and arithmetic means for calculating said control signal to be output to said frequency division means from the horizontal sync signal and wherein said arithmetic means output a charge pump setting signal, wherein said variable-capacity charge pump means varies its capacity based upon said charge pump setting signal so as to compensate for a variation in PLL loop gain.

2. A system according to claim 1, wherein said charge pump means comprises:

a pair of series-connected first MOS transistors which receive outputs from said phase comparison means through gates and output outputs from drains to said filter means; and a pair of variable current sources which are connected to sources of said first MOS transistors and operate to compensate for a variation in PLL loop gain by using said charge pump setting signal from said arithmetic means.

3. A system according to claim 2, wherein a gain of said charge pump is represented by Kn, and the frequency division ratio of said frequency division means changes from Nn to Na, said arithmetic means controls the gain Ka of said charge pump to satisfy Ka=Kn·Na/Nn.

4. A system according to claim 3, wherein said arithmetic means comprises a logic circuit for forming a decoder on the basis of a frequency division ratio signal.

5. A system according to claim 2, wherein said variable current source comprises:

a D/A converter for converting said charge pump setting signal from said arithmetic means into analog signal;

a voltage follower for level-converting an output voltage from said D/A converter; and a current mirror circuit for controlling a current in said first MOS transistors in accordance with an output voltage from said voltage follower.

6. A system according to claim 5, wherein said voltage follower comprises:

an operational amplifier for receiving an output voltage from said D/A converter as a first input; and a second MOS transistor having a gate connected to an output terminal of said operational amplifier, a source connected to a resistor and feedback-connected to a second input, and a drain from which an output current is extracted.

7. A system according to claim 6, wherein said current mirror circuit comprises:

a first current mirror section comprising a pair of P-channel MOS transistors, which has an input terminal to which the drain of said second MOS transistor is connected, and an output terminal to which a source of one of said first MOS transistors is connected;

a third MOS transistor having a gate connected to the drain of said second MOS transistor; and a second current mirror section comprising a pair of N-channel MOS transistors, which has an input terminal to which the drain of said third MOS transistor is connected, and an output terminal to which a source of the other of said first MOS transistors is connected.

8. A system according to claim 7, wherein
said second MOS transistor is an N-channel MOS transistor, and
said third MOS transistor is a P-channel MOS transistor.

9. A system according to claim 7, wherein
said phase comparison means outputs a positive-phase signal based on a phase comparison result as a phase error signal, and
said first MOS transistors comprise a P-channel MOS transistor having a gate to which a positive-phase signal output from said phase comparison means is input, and
an N-channel MOS transistor having a gate to which a negative-phase signal output from said phase comparison means is input.

10. The system of claim 1, wherein said charge pump means comprises a pair of series-connected first MOS transistors which receive outputs from said phase comparison means through gates and which issue outputs from drains to said filter means.

11. The system of claim 10, wherein said charge pump means comprises a pair of variable current sources which are connected to sources of said first MOS transistors and operate to compensate for a variation in said PLL loop gain by using said charge pump setting signal from said arithmetic means.

12. a PLL system comprising:
a phase comparator for comparing a phase of an input horizontal sync signal with a phase of a reference signal for a display system which is generated by deflection processing in a CRT;
a variable-capacity charge pump for outputting a charge pump signal in accordance with a phase error signal output from said phase comparator;
a voltage-controlled oscillator whose oscillation frequency changes in accordance with a voltage control signal based on the charge pump signal output from said charge pump;
a frequency divider for frequency-dividing a frequency signal from said voltage-controlled oscillator in accordance with a control signal; and
control means for measuring a frequency of a horizontal sync signal and setting a frequency division ratio for said frequency divider so as to keep a frequency of a system clock for a CRT monitor constant and controlling a current capacity of said variable-capacity charge pump so as to keep a PLL loop gain constant when the frequency division ratio in said frequency divider changes.

13. A PLL system comprising:
a phase comparator receiving a horizontal sync signal and a flyback pulse signal and generating an error signal based upon a comparison of said horizontal sync signal and said flyback pulse signal that is based upon a frequency division ratio;
an arithmetic unit receiving said horizontal sync signal and generating a control signal; and
a variable-capacity charge pump in communication with said phase comparator and said arithmetic unit for generating a charge pump signal based upon said error signal and having a current capacity varied based upon said control signal so as to keep loop gain constant.

14. The system of claim 13, further comprising:
a filter in communication with said variable-capacity charge pump;
a voltage-controlled oscillator in communication with said filter;
a frequency divider in communication with said voltage-controlled oscillator and said arithmetic unit; and
a CRT drive circuit in communication with said frequency divider and said phase comparator.

15. The system of claim 13, further comprising a logic circuit in communication with said arithmetic unit and said charge pump.

16. The system of claim 15, wherein said logic circuit comprises a decoder and said control signal is said frequency division ratio.

17. The system of claim 13, wherein said variable-capacity charge pump comprises:
a pair of series-connected first MOS transistors in communication with said phase comparator; and
a pair of variable current sources in communication with said first MOS transistors and said arithmetic unit.

18. The system of claim 17, wherein said variable current source comprises:
a D/A converter in communication with said arithmetic unit;
a voltage follower in communication with said D/A converter; and
a current mirror circuit in communication with said voltage follower and said first MOS transistors.

19. The system of claim 18, wherein said voltage follower comprises:
an operational amplifier in communication with said D/A converter; and
a second MOS transistor in communication with said operational amplifier, a resistor and said current mirror circuit.

20. The system of claim 19, wherein said current mirror circuit comprises:
a first current mirror section comprising a pair of P-channel MOS transistors in communication with said second MOS transistor and said first MOS transistors;
a third MOS transistor in communication with said second MOS transistor; and
a second current mirror section comprising a pair of N-channel MOS transistors in communication with said third MOS transistor and said first MOS transistor.

21. The system of claim 20, wherein said second MOS transistor is an channel MOS transistor; and
said third MOS transistor is a P-channel MOS transistor.

22. The system of claim 13, wherein said charge pump gain satisfies Ka=Kn (Na/Nn), wherein Kn is an initial charge pump gain, Nn is an initial frequency division ratio, Na is a subsequent frequency division ratio and Ka is a subsequent charge pump gain.

* * * * *